(12) United States Patent
Kanter (10) Patent No.: US 9,608,851 B2
(45) Date of Patent: Mar. 28, 2017

(54) TURBO DECODING TECHNIQUES

(71) Applicant: Jonathan Kanter, Olympic Valley, CA (US)

(72) Inventor: Jonathan Kanter, Olympic Valley, CA (US)

(*) Notice: Subject to any disclaimer, the term of this patent is extended or adjusted under 35 U.S.C. 154(b) by 0 days.

(21) Appl. No.: 15/132,077

(22) Filed: Apr. 18, 2016

(65) Prior Publication Data

US 2016/0234054 A1 Aug. 11, 2016

Related U.S. Application Data

(63) Continuation-in-part of application No. 14/199,940, filed on Mar. 6, 2014, now Pat. No. 9,319,250.

(Continued)

(51) Int. Cl.
*H04L 27/06* (2006.01)
*H04L 27/26* (2006.01)
(Continued)

(52) U.S. Cl.
CPC ...... *H04L 27/2649* (2013.01); *H03M 13/258* (2013.01); *H03M 13/2732* (2013.01); *H04B 1/12* (2013.01); *H04L 25/03159* (2013.01); *H03M 13/11* (2013.01); *H03M 13/23* (2013.01); *H04L 5/0046* (2013.01); *H04L 27/2647* (2013.01)

(58) Field of Classification Search
CPC ............. H03M 13/258; H03M 13/256; H03M 13/2957; H03M 13/45; H03M 13/2767; H03M 13/2771; H03M 13/11; H03M 13/23; H03M 13/2732; H04L 1/006; H04L 1/0066; H04L 27/01; H04L 1/0003; H04L 27/0008; H04L 5/0046; H04L 1/0057; H04L 2001/0098; H04L 2025/03414; H04L 1/0643; H04L 25/03159; H04L 27/2649; H04L 27/2647; H04B 1/12
USPC ............... 375/261, 262, 265, 316, 340, 341; 370/203, 208, 210; 714/746
See application file for complete search history.

(56) References Cited

U.S. PATENT DOCUMENTS 4,633,470 A 12/1986 Welch et al.
4,945,549 A 7/1990 Simon et al.
(Continued)

FOREIGN PATENT DOCUMENTS

EP 1233565 A2 8/2002
EP 2566054 A1 3/2013
(Continued)

OTHER PUBLICATIONS

"Asymmetric Digital Subscriber Line (ADSL) transceivers—Extended bandwidth ADSL2 (ADSL2+)," Series G: Transmission Systems and Media, Digital Systems and Networks, International Telecommuncation Union, G.9925, Jan. 2005 (110 pages).
(Continued)

*Primary Examiner* — Tesfaldet Bocure
(74) *Attorney, Agent, or Firm* — Perkins Coie LLP (57) ABSTRACT

Techniques are disclosed for turbo decoding orthogonal frequency division multiplexing (OFDM) symbols. Techniques for combined turbo decoding and equalization are disclosed. The disclosed techniques can be implemented in receivers that receive wired or wireless OFDM signals and produce data and control bits by decoding the received signals. The techniques may be incorporated within an ADSL or a VDSL receiver.

19 Claims, 11 Drawing Sheets

Related U.S. Application Data (60) Provisional application No. 61/802,038, filed on Mar. 15, 2013.

(51) Int. Cl.

| | | |
|---|---|---|
| *H03M 13/25* | (2006.01) | |
| *H03M 13/27* | (2006.01) | |
| *H04B 1/12* | (2006.01) | |
| *H04L 25/03* | (2006.01) | |
| H03M 13/11 | (2006.01) | |
| H03M 13/23 | (2006.01) | |
| H04L 5/00 | (2006.01) | |

(56) References Cited

U.S. PATENT DOCUMENTS

| | | |
|---|---|---|
| 5,258,987 A | 11/1993 | Wei |
| 5,446,747 A | 8/1995 | Berrou |
| 6,307,901 B1 | 10/2001 | Yu et al. |
| 6,757,859 B1 | 6/2004 | Jin |
| 6,795,507 B1 | 9/2004 | Xin et al. |
| 7,212,569 B1 | 5/2007 | Clark |
| 7,243,294 B1 | 7/2007 | Divsalar et al. |
| 7,340,000 B1 | 3/2008 | Hart et al. |
| 7,974,372 B2 | 7/2011 | Yoshida |
| 2001/0025358 A1 | 9/2001 | Eidson et al. |
| 2001/0054170 A1 | 12/2001 | Chass et al. |
| 2002/0057734 A1 | 5/2002 | Sandberg et al. |
| 2003/0072382 A1 | 4/2003 | Raleigh et al. |
| 2004/0247038 A1 | 12/2004 | Uesugi et al. |
| 2006/0023802 A1 | 2/2006 | Balakrishnan et al. |
| 2006/0092902 A1 | 5/2006 | Schmidt |
| 2007/0041440 A1 | 2/2007 | Schoenbeck et al. |
| 2007/0147535 A1 | 6/2007 | Niu et al. |
| 2008/0232499 A1 | 9/2008 | Guerrieri et al. |
| 2008/0273614 A1 | 11/2008 | Heegard et al. |
| 2009/0046796 A1 | 2/2009 | Park et al. |
| 2009/0135934 A1 | 5/2009 | Guerrieri et al. |
| 2011/0051831 A1 | 3/2011 | Subrahmanya et al. |
| 2011/0194475 A1 | 8/2011 | Kim et al. |
| 2012/0079341 A1 | 3/2012 | Wajeer et al. |
| 2012/0106619 A1 | 5/2012 | Kawauchi et al. |
| 2012/0134446 A1 | 5/2012 | Zhou et al. |
| 2012/0326898 A1 | 12/2012 | Bossert et al. |
| 2013/0202060 A1 | 8/2013 | Nishikawa |
| 2014/0119474 A1 | 5/2014 | Petrov |
| 2014/0129895 A1 | 5/2014 | Petrov |
| 2014/0269891 A1 | 9/2014 | Kanter |
| 2014/0344648 A1 | 11/2014 | Kanter |

FOREIGN PATENT DOCUMENTS

| | | |
|---|---|---|
| TW | 201110607 | 3/2011 |
| TW | 201141149 | 11/2011 |
| WO | 2012158083 A1 | 11/2012 |
| WO | 2014150061 A1 | 9/2014 |
| WO | 2014150070 A2 | 9/2014 |

OTHER PUBLICATIONS

"Asymmetric digital subscriber line transceivers 2 (ADSL2)," Series G: Transmission Systems and Media, Digital Systems and Networks, International Telecommuncation Union, G.992.3, Apr. 2009 (404 pages).

"LTE Evolved Universal Terrestrial Radio Access (E-UTRA); Multiplexing and channel coding (3GPP TS 36.212 version 8.4.0 Release 8)," European Telecommunications Standards Institute, Nov. 2008 (58 pages).

"Very high speed digital subscriber line transceivers 2 (VDSL2)," Series G: Transmission Systems and Media, Digital Systems and Networks, International Telecommuncation Union, G.993.2, Dec. 2011 (376 pages).

Austin, M.E, "Decision-Feedback Equalization for Digital Communication Over Dispersive Channels," Massachusetts Institute of Technology, Research Laboratory of Electronics, Technical Report 437, Aug. 11, 1967 (102 pages).

Benedetto, S., et al. "Serial Concatenation of Interleaved Codes: Performance Analysis, Design, and Iterative Decoding," IEEE Transactions on Information Theory, vol. 44, Issue 3, May 1998 (18 pages).

Douillard, C., et al. "Iterative Correction of Intersymbol Interference: Turbo-Equalization," ENST de Bretagne, vol. 6, Issue 5, Sep.-Oct. 1995 (5 pages).

Forney, G., "Burst-Correcting Codes for the Classic Bursty Channel," IEEE Transactions on Communications Technology, vol. COM-19, Issue 5, Oct. 1971 (10 pages).

Forney, G., "The Viterbi Algorithm," Proceedings of the IEEE, vol. 61, Issue 3, Mar. 1973 (11 pages).

Glavieux, A., et al. "Turbo Equalization Over a Frequency Selective Channel," International Symposium on Turbo Codes, 1997 (7 pages).

Hall, E., "Stream-Oriented Turbo Codes," IEEE Transactions on Information Theory, vol. 47, Issue 5, Jul. 2001 (19 pages).

International Search Report and Written Opinion dated Jul. 1, 2014 for International Application No. PCT/US2014/022061, filed Mar. 7, 2014 (8 pages).

International Search Report and Written Opinion dated Sep. 12, 2014 for International Application No. PCT/US2014/022089, filed Mar. 7, 2014 (12 pages).

Laot, C., et al. "Turbo Equalization: Adaptive Equalization and Channel Decoding Jointly Optimized," IEEE Journal on Selected Areas in Communications, vol. 19, Issue 9, Sep. 2001 (9 pages).

Massey, J., "Shift-Register Synthesis and BCH Decoding," IEEE Transactions on Information Theory, vol. IT-15, Issue 1, Jan. 1969 (6 pages).

Ramsey, J., "Realization of Optimum Interleavers," IEEE Transactions on Information Theory, vol. IT-16, Issue 3, May 1970 (8 pages).

Raphaeli, D., et al. "Combined Turbo Equalization and Turbo Decoding" IEEE Communications Letters, vol. 2, ssue 4, Apr. 1998 (5 pages).

Reed, I.S., et al. "Polynomial Codes Over Certain Finite Fields," J. Sac. Ind. Appl. Math., vol. 8, pp. 300-304, Jun. 1960, (2 pages).

Tuchler, M., et al. "Turbo Equalization: Principles and New Results," IEEE Transactions on Communications, vol. 50, Issue 5, May 2002 (14 pages).

Ungerboeck, G., "Channel Coding with Multilevel/Phase Signals," IEEE Transactions on Information Theory, vol. IT-28, Issue 1, Jan. 1982 (13 pages).

Viterbi, A., "Error Bounds for Convolutional Codes and an Asymptotically Optimum Decoding Algorithm," IEEE Transactions on Information Theory, vol. IT-13, Issue 2, Apr. 1967 (10 pages).

Wei, L., "Trellis-Coded Modulation with Multidimensional Constellations," IEEE Transactions on Information Theory, vol. IT-33, Issue 4, Jul. 1987 (19 pages).

Yoshida, M., et al. "An LDPC-Coded OFDM Receiver with pre-FFT Iterative Equalizer for ISI Channels," IEEE, 2005 (4 pages).

Benedetto, S., et al. "Iterative decoding of serially concatenated convolutional codes," Electronics Letters, vol. 32, Issue 13, Jun. 1996 (3 pages).

Taiwan Intellectual Property Office, Office Action, Taiwan Patent Application No. 103108983, Jul. 14, 2016, 5 pages.

TURBO DECODING TECHNIQUES

CROSS-REFERENCE TO RELATED APPLICATION(S)

This patent document claims the benefit of U.S. Provisional Patent Application No. 61/802,038, filed on Mar. 15, 2013. This patent document is a Continuation-In-Part of U.S. patent application Ser. No. 14/199,940, entitled "Turbo Decoding Techniques," now U.S. Pat. No. 9,319,250, issued on Apr. 19, 2016. The entire contents of the before-mentioned patent applications are incorporated by reference herein.

TECHNICAL FIELD

This document relates to digital communication.

BACKGROUND

Many modern digital communication systems use orthogonal frequency division multiplexing (OFDM) modulation technology. Various types of error correction codes are used to increase robustness of transmitted signals. For example, OFDM and error coding is used in wireless technologies such as Long Term Evolution (LTE) and wired communication technologies such as digital subscriber line (DSL).

SUMMARY

This document describes technologies, among other things, for turbo decoding of OFDM modulation signals. In some implementations, a combined turbo decoding and turbo equalization technique may be used.

In one aspect, methods, systems and apparatus for turbo decoding including serially concatenated TCM and Reed Solomon block codes, with convolutional interleaving, are disclosed.

In another aspect, methods, systems and apparatus for turbo decoding of serially concatenated TCM and Reed Solomon block codes, with convolutional interleaving, using constellations of variable sizes as part of the same code block are disclosed. Where the least significant bits of constellations are both block coded and trellis coded, and the most significant bits are block coded only.

In another aspect disclosed techniques provide for a buffer for constellations from more than one OFDM symbol, which provides for turbo decoding of convolutional interleaving over more than one OFDM symbol is disclosed. Alternatively, this buffer may be after the SISO constellation demapper, for demapped constellations.

In another aspect, a SISO synchronization buffer for the block coded only bits from the SISO constellation demapper is disclosed. The buffer also accepts the bits from the SISO trellis decoder and assembles them into bytes.

In another aspect, a turbo decoder comprising a feedback path is disclosed.

In another aspect, a turbo decoder comprising a pipeline, with pipelined modules corresponding to one or more iterations of turbo decoding is disclosed.

In another aspect, the disclosed data reception techniques use a constellation demapper and mapper that supports variable size constellations.

These and other aspects, and their implementations and variations are set forth in the drawings, the description and the claims.

BRIEF DESCRIPTION OF THE DRAWINGS

Like reference symbols in the various drawings indicate like elements.

DETAILED DESCRIPTION

Techniques for turbo decoding and turbo equalization of received signals to produce data bits are disclosed. In the description, the following abbreviations are used.

ADSL=Asymmetric Digital Subscriber Line
AFE=Analog Front End
ASIC=Application Specific Integrated Circuit
BPSK=Binary Phase Shift Keying
DSL=Digital Subscriber Line
EPROM=Erasable Programmable Read Only Memory
EEPROM=Electrically Erasable Programmable Read Only Memory
FEQ=Frequency Domain Equalizer
FFT=Fast Fourier Transform
FPGA=Field Programmable Gate Array
HIHO=Hard Input Hard Output
HISO=Hard Input Soft Output
IEEE=Institute of Electrical and Electronics Engineers
IFFT=Inverse Fast Fourier Transform
ITU=International Telecommunications Union
LLR=Log Likelihood Ratio
LSBs=Least Significant Bits
MAP=Maximum a Posteriori
MSBs=Most Significant Bits
MSE=Mean Squared Error
n-QAM=Quadrature Amplitude Modulation
n-QPSK=Quadrature Phase Shift Keying
OFDM=Orthogonal Frequency Division Multiplexing
PAR=Peak to Average Ratio
SIHO=Soft Input Hard Output
SISO=Soft Input Soft Output
SNR=Signal to Noise Ratio
SOVA=Soft Output Viterbi Algorithm
SSE=Sum of Squared Errors
TCM=Trellis Coded Modulation
VDSL=Very High Speed Digital Subscriber Line The International Telecommunications Union (ITU) standards for Asymmetric Digital Subscriber Line (ADSL) and Very High Speed Digital Subscriber Line (VDSL) transceivers specify an error correcting code consisting of concatenated trellis coded modulation (TCM) and Reed Solomon block codes, with convolutional interleaving. The standards also specify Orthogonal Frequency Division Multiplexing (OFDM) for modulation and demodulation. OFDM is a multicarrier technique, which uses an Inverse Fast Fourier Transform (IFFT) for modulation and a Fast Fourier Transform (FFT) for demodulation. The sizes of the signal constellations in the frequency bins of the IFFT and FFT (i.e. assigned to each of the carriers) are variable. The least significant bits of the constellations are both block coded and trellis coded, while the most significant bits are block coded only. This arrangement of providing greater error correction protection is beneficial because, often, in real life physical transmission medium, the impact of noise is greater on lsbs and not as great on msbs.

Turbo decoding significantly improves the coding gain of error correcting codes. Turbo decoding is the iterative decoding of concatenated codes. It was originally designed for parallel concatenated convolutional codes, and has been extended to serially concatenated convolutional codes, concatenated trellis coded modulation, and concatenated trellis coded modulation and block codes.

Present day receivers compatible with the ADSL and VDSL standards have done a single decoding; they have not been able to decode iteratively. In some embodiments, their coding gain would be improved by being able to turbo decode concatenated TCM and Reed Solomon block codes, with convolutional interleaving, using OFDM with variable size constellations.

Figure 1:
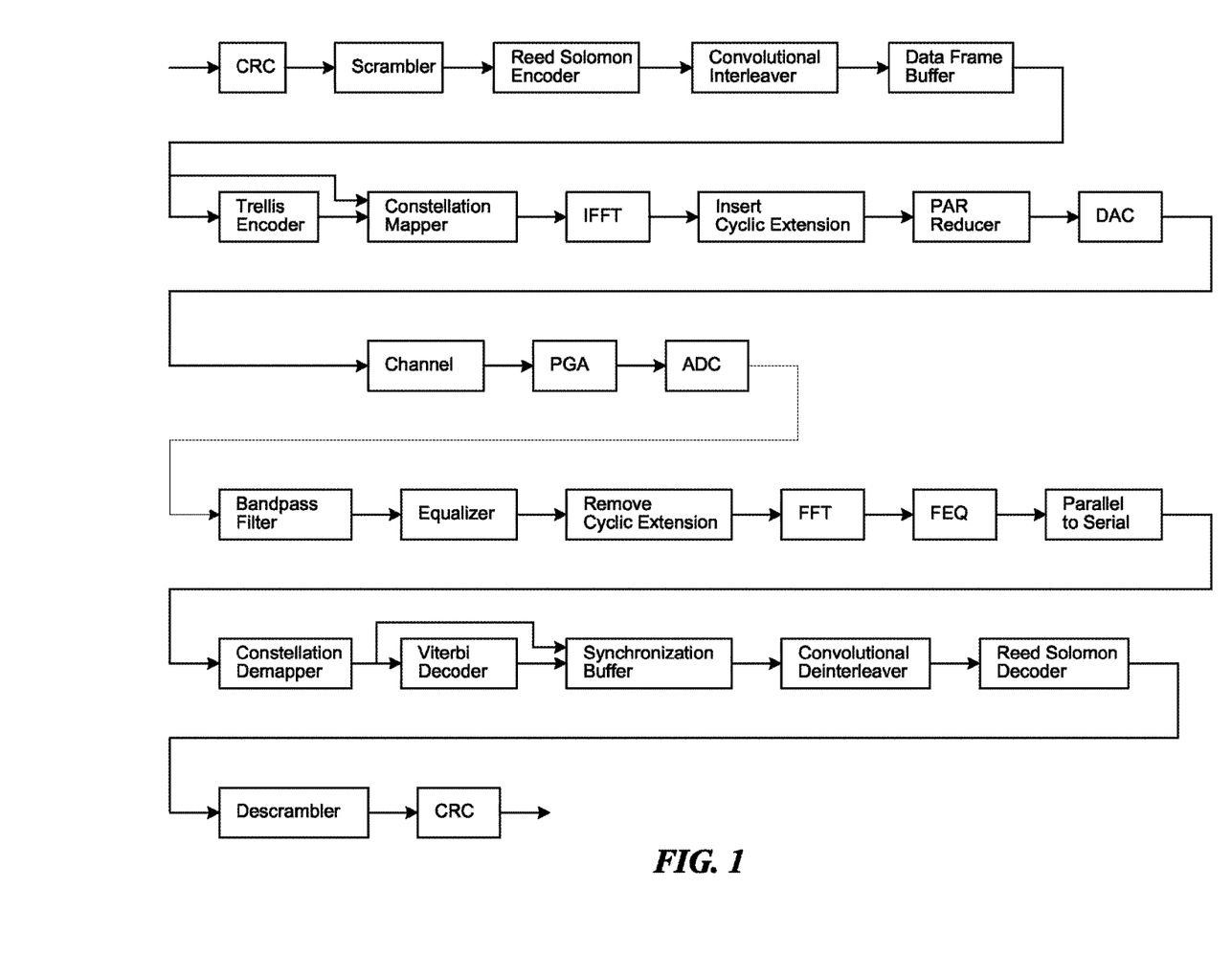
FIG. 1 illustrates a digital subscriber loop (DSL) transmitter and receiver with non-iterative decoder.

FIG. 1 depicts a block diagram example of a DSL transmitter and a DSL receiver with a non-iterative decoder. Conventional decoding of the concatenated code in the ADSL and VDSL standards uses a single pass, non-iterative, decoder. A soft input constellation demapper precedes the decoder. The inputs to the constellation demapper are constellation points, which each represent from one to fifteen bits, and how many bits each constellation represents. The outputs are encoded bits. The outputs for the two least significant bits (which are both block coded and trellis coded) are soft outputs e.g., 0 and 1 with reliability information.) The outputs for the thirteen most significant bits (which are block coded only) are hard outputs (e.g., 0 and 1 decisions, without any reliability information.) The soft outputs from the constellation demapper go to a soft input hard output Viterbi decoder. The hard outputs from the Viterbi decoder, and from the constellation demapper, go to a synchronization buffer. This processing delays the outputs from the constellation demapper, to account for the latency of the Viterbi decoder, and assembles the bits into bytes. The bytes from the synchronization buffer go to convolutional deinterleaver. The deinterleaved bytes become the codewords input to a hard input hard output Reed Solomon decoder. Some hard output Reed Solomon decoders, while using hard information at the bit level, can use soft information at the byte level for errors and erasures decoding.

Figure 2:
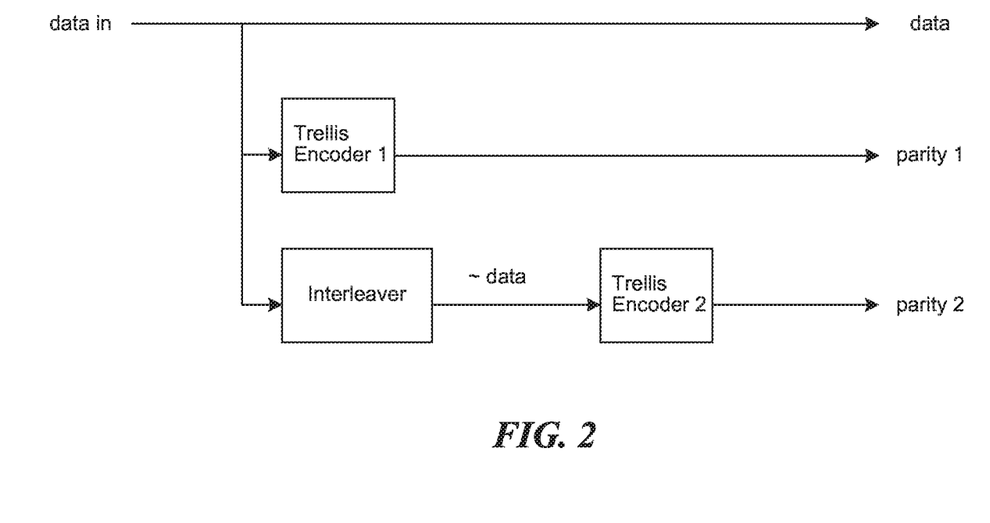
FIG. 2 illustrates an encoder for parallel concatenated convolutional codes.
Figure 3:
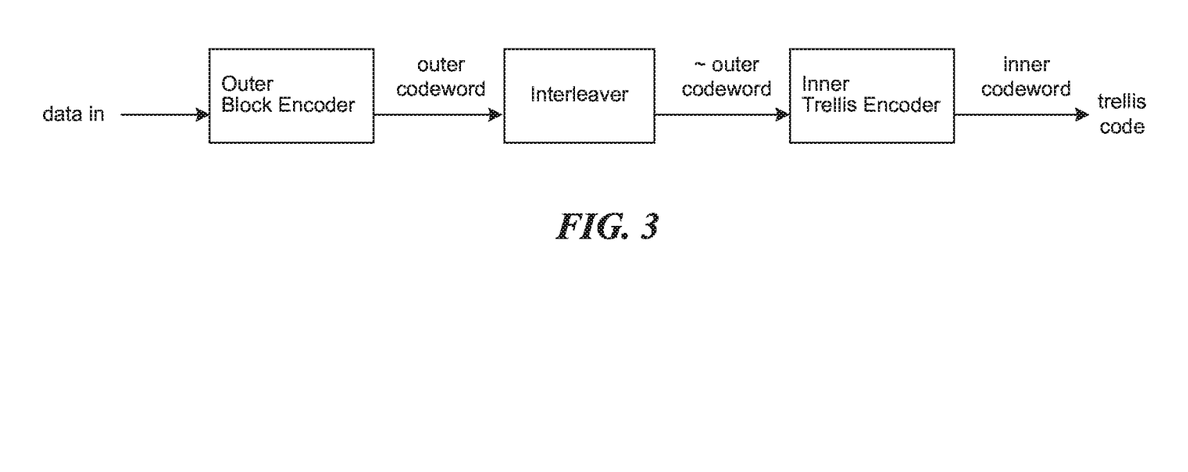
FIG. 3 illustrates an encoder for serially concatenated trellis coded modulation (TCM) and block codes.
Figure 4:
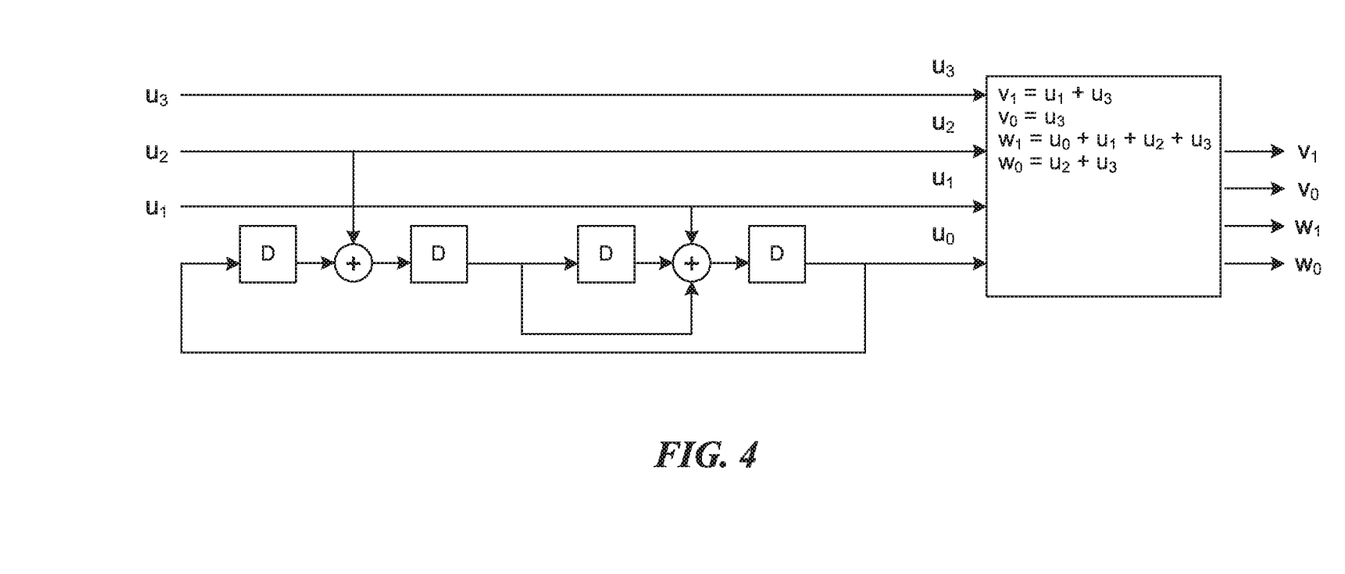
FIG. 4 illustrates a trellis encoder having a convolutional encoder and bit convertor.

Conventional techniques for turbo decoding of concatenated trellis coded modulation and block codes has been for a fixed size constellation, with all of the bits of the constellation being both block coded and trellis coded. FIG. 2 illustrates an encoder for parallel concatenated convolutional codes. FIG. 3 illustrates an encoder for serially concatenated trellis coded modulation (TCM) and block codes. FIG. 4 illustrates a trellis encoder having a convolutional encoder and a bit convertor.

As an alternative to turbo decoding the code in the ADSL and VDSL standards, there have been proposals to add different types of codes to the standards, for which there is prior art for iterative decoding. There have been proposals to add parallel concatenated convolutional codes, parallel concatenated convolutional codes with trellis coded modulation, and low density parity check codes.

Turbo Decoding of Serially Concatenated TCM and Reed Solomon Block Codes, with Convolutional Interleaving In some embodiments, turbo decoding of serially concatenated TCM and Reed Solomon block codes, with convolutional interleaving, using constellations of variable sizes as part of the same code block, may be performed. As mentioned previously, the least significant bits of constellations are both block coded and trellis coded, and the most significant bits are block coded only.

A buffer may be provided for constellations from more than one OFDM symbol. The buffer provides for turbo decoding of convolutional interleaving over more than one OFDM symbol. Alternatively, this buffer may be after the SISO constellation demapper, for demapped constellations. In various embodiments the buffer may be sufficiently large to hold constellations from 2 to 8 OFDM symbols. For example, in some embodiments, the buffer may be 64K long.

A SISO synchronization buffer may be configured for the block coded only bits from the SISO constellation demapper and may also accept the bits from the SISO trellis decoder, and assemble them into bytes. Alternatively, or additionally, a synchronization buffer may be configured for the block coded only bits from the SISO constellation demapper and may also accept the bits from the SIHO trellis decoder, and assemble them into bytes.

Figure 6:
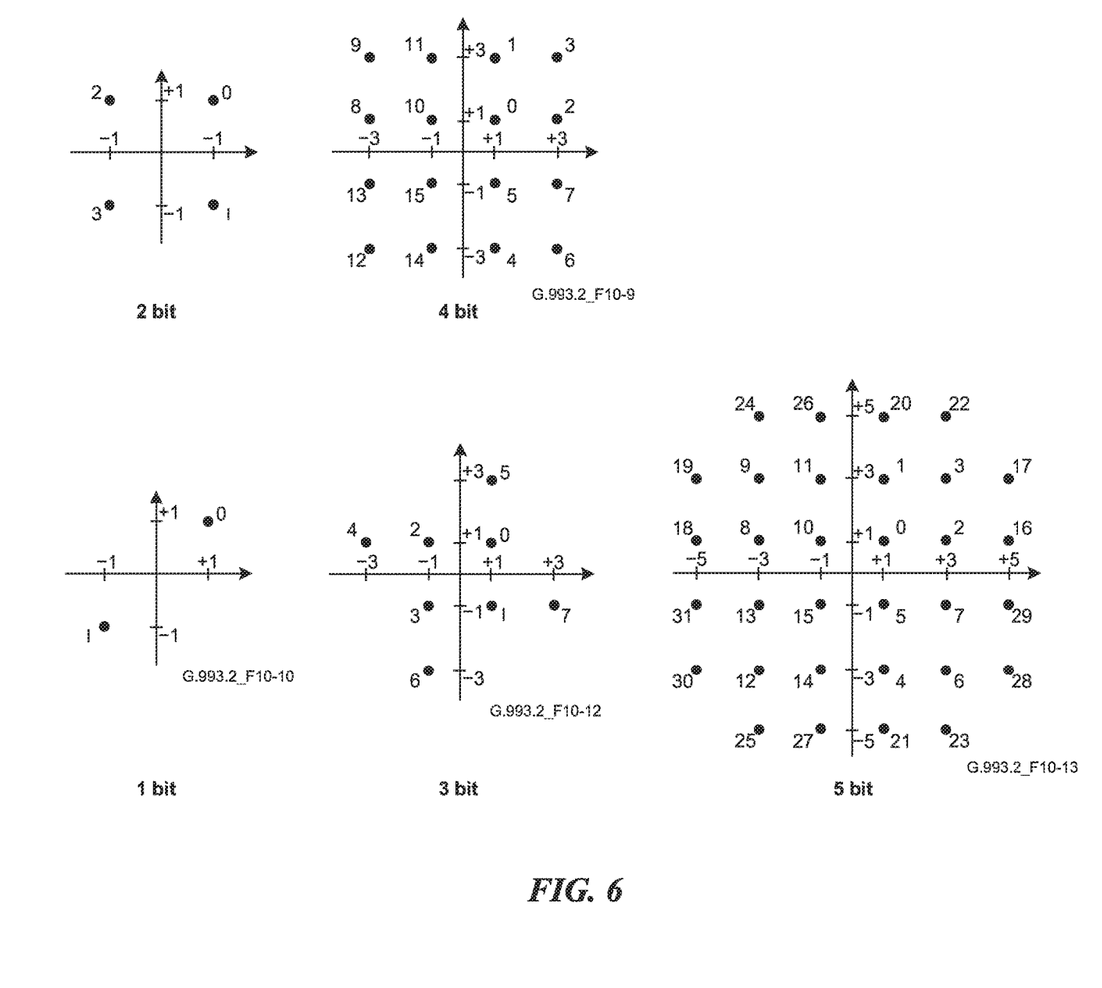
FIG. 6 depicts various constellations used in digital communications.

In some embodiments, a turbo decoder supports, or decodes, the serially concatenated TCM and Reed Solomon block coding, with convolutional interleaving, in the ADSL and VDSL standards. It supports variable sized constellations (see, e.g., FIG. 6), where the least significant bits are both block coded and trellis coded, and the most significant bits are block coded only. The convolutional interleaving may be performed over multiple OFDM time domain symbols.

In some embodiments, a turbo decoder includes modules for turbo decoding the error correcting code in the DSL, ADSL, VDSL and similar standards, including: a buffer for constellations from more than one OFDM symbol, a SISO constellation, a SISO trellis decoder, a SISO synchronization buffer, a SISO convolutional deinterleaver, a SISO Reed Solomon decoder, and a SISO convolutional interleaver. Or including: a buffer for constellations from more than one OFDM symbol, a SISO constellation demapper, a SIHO trellis decoder, a synchronization buffer, a convolutional deinterleaver, a HISO Reed Solomon, and a SISO convolutional interleaver.

ADSL and VDSL are multicarrier systems which use an Inverse Fast Fourier Transform (IFFT) for modulation, and a Fast Fourier Transform (FFT) for demodulation. Each of the frequency bins of the IFFT and FFT contains a point in a signal constellation. In the scheme, each constellation point is a point in the Euclidean plane, described by a complex number, $Z=X+jY$, which represents modulated data. For hard data, X and Y may be odd integers, for example, as defined in the ADSL and VDSL standards. The constellations may be of variable sizes, e.g., each constellation point may represent from 1 to 15 bits. I.e. the modulation for each frequency bin can range from BPSK to 32K QAM. Some frequency bins may be unused, and represent 0 bits. A table stores the number of data bits for each frequency bin (subcarrier) from f=0 to the highest transmitted frequency bin. n data bits are mapped to one of 2^n constellation points.

The Reed Solomon coding used by the ADSL and VDSL standards is a conventional byte based Reed Solomon code with its operations in Galois Field $GF(2^8)$. Where the number of message bytes is k, the number of parity bytes r, and the number of codeword bytes n=k+r.

The message polynomial is $m(x)=m_0x^{k-1}+m_1x^{k-2}+\ldots+m_{k-2}x+m_{k-1}$.

The parity polynomial is $p(x)=p_0x^{r-1}+p_1x^{r-1}+\ldots+p_{r-2}x+p_{r-1}$.

The generator polynomial is $g(x)=(x+\alpha)(x+\alpha^2)(x+\alpha^3)\ldots(x+\alpha^r)$.

The codeword is $c(x)=m(x)x^r+p(x)$.

And $p(x)=m(x)x^r \bmod g(x)$.

Figure 5:
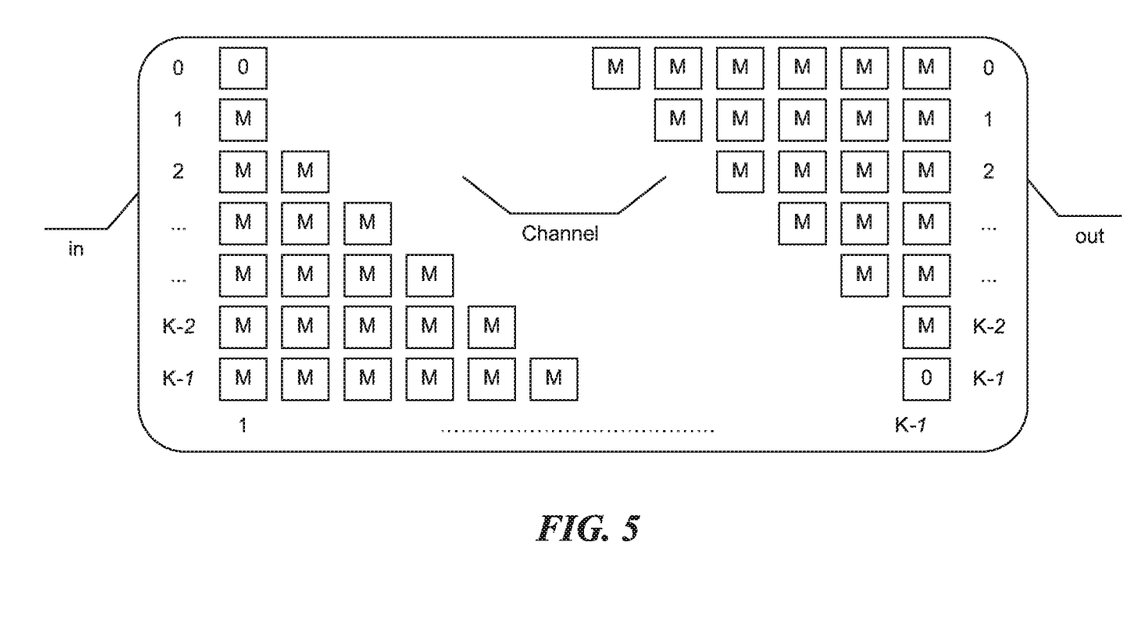
FIG. 5 illustrates a generalized triangular interleaver.

FIG. 5 illustrates a generalized triangular interleaver. The convolutional interleaver used by the ADSL and VDSL standards is a generalized triangular interleaver. The bytes of the Reed Solomon codewords are delayed by an amount that varies linearly with the byte index i. Byte $B_i$ is delayed by $(D\times1)\times i$ bytes, where D is the interleaver depth. And $(D-1)=M\times K$. Where K is the interleaver block length (or number of delay lines), and M is a nonnegative integer number of bytes.

Referring again to FIG. 4, the trellis coding used by the ADSL and VDSL standards is Wei's 4D 16 state code. Bits $u_2 \ldots u_1$ are input to a recursive systematic convolutional encoder of rate 2/3, which outputs bits $u_2 \ldots u_0$. Bits $u_3 \ldots u_0$ are input to a bit converter with equations $v_1=u_1+u_3$, $v_0=u_3$, $w_1=u_0+u_1+u_2+u_3$, $w_0=u_2+u_3$. Bits $v_1 \ldots v_0$, and $w_1 \ldots w_0$ become the two least significant bits input to the constellation mapper on alternate mappings.

Figure 9:
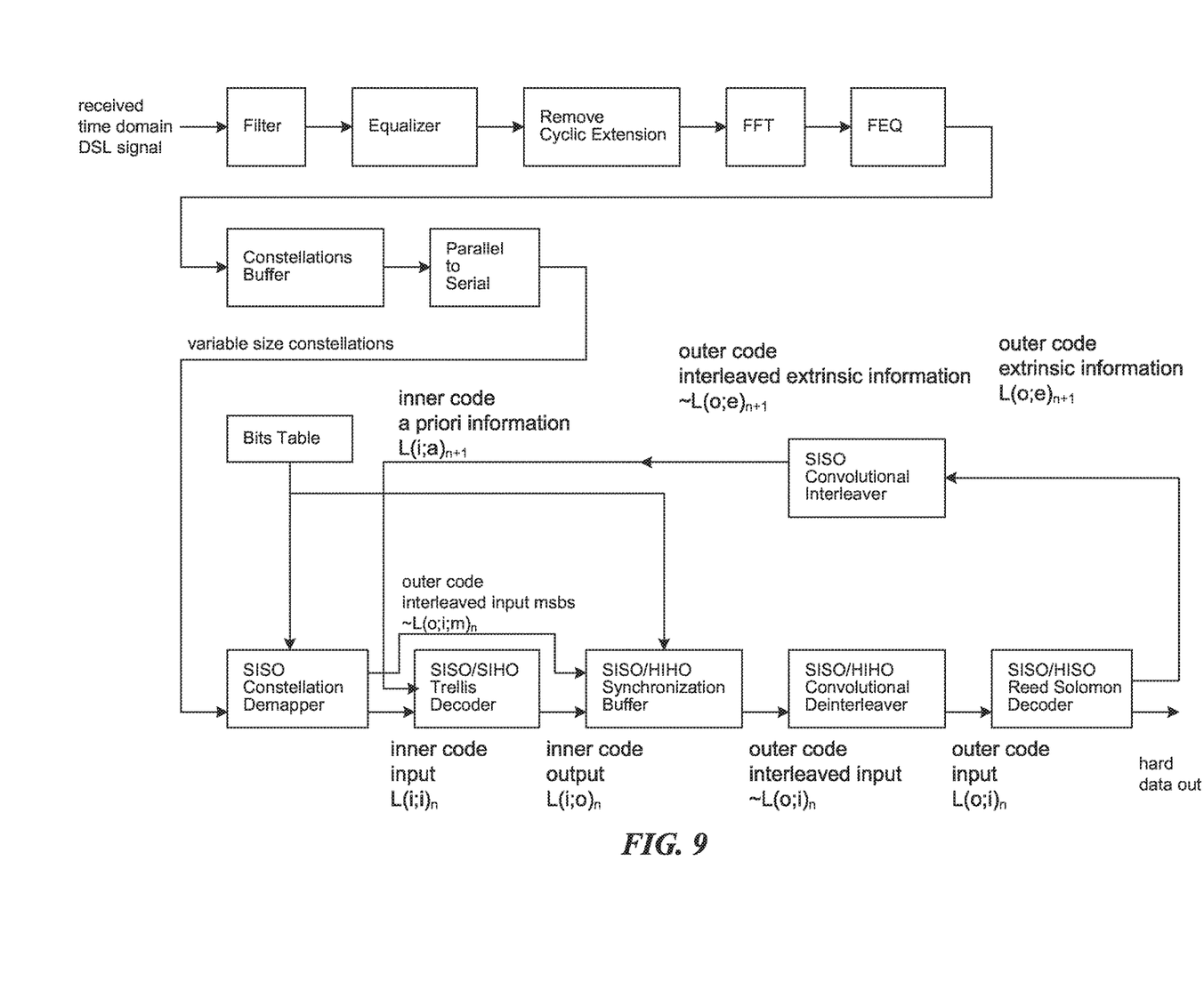
FIG. 9 is a block diagram representation of turbo decoder used in a DSL receiver.

With reference to FIG. 9, in some embodiments, the received time domain DSL signal is filtered, and may be equalized in the time domain. The cyclic extension is removed from the filtered and equalized signal, giving a time domain signal whose length matches that of the modulating IFFT. An FFT transforms the time domain signal to points in signal constellations in the frequency domain. The result may give one constellation point for each used frequency bin. The constellation points go to a Frequency Domain Equalizer (FEQ), which does one complex multiplication of each constellation point, to correct amplitude and phase.

The equalized constellation points go to a constellations buffer for the constellation points from more than one OFDM symbol. The constellations buffer is large enough for the extent of the convolutional interleaving, as extrinsic information is fed back from Reed Solomon codeword bytes that may have been interleaved over more than one OFDM symbol. In some embodiments, the structure of the constellations buffer is a sliding window or shift register type of structure. Then a parallel to serial converter outputs the constellation points to a SISO constellation demapper. Alternatively demapped constellations could be buffered.

The SISO constellation demapper has two inputs: Constellation points which represent from one to fifteen bits and the number of bits that each constellation represents. A bits table stores the number of bits carried by each frequency bin. It outputs encoded data for soft decoding. For error correcting codes, soft inputs and outputs refer to data bits represented as a log likelihood ratio (LLR). Where for data bit d, $LLR(d)=\log(Pr(d=1)/Pr(d=0))$, or an approximation. The SISO constellation demapper may also accept extrinsic information which has been re-encoded and re-mapped by a SISO constellation mapper.

Decoders may output LLRs calculated exactly by the MAP algorithm, or approximately using the concept of a concurrent path (for trellis decoders) or concurrent codeword (for block decoders). Call the received codeword R, the set of soft received bits $r_n$ and D the hard decoded codeword, with minimum Euclidean distance to R, and bits $d_n$. Call $C_n$ the concurrent codeword, with minimum Euclidean distance to R, and $c_n=\sim d_n$. Then approximations used include: $LLR_n \approx d_n \times ((R-C_n)-(R-D))$. And $LLR_n \approx d_n \times ((R-C_n)^2-(R-D)^2)/4$.

Hard input, Reed Solomon decoders may be based on algebraic decoding algorithms, including one of the Berlekamp Massey, Euclidean, and Peterson Gorenstein Zierler algorithms. They may output LLRs based on algebraic indications of the decoding reliability, or on the input SNR, MSE, or SSE. The intermediate or final results of algebraic decoding may provide indications of the decoding reliability. The intermediate or final results may indicate one or more of the following conditions: 1. The syndromes polynomial of the input codeword equals zero. 2. The degree of the error locator polynomial is less than or equal to the number of correctable errors. 3. The degree of the error evaluator polynomial is less than the degree of the error locator polynomial. 4. Error locations have nonzero error magnitudes. 5. The syndromes polynomial of the corrected codeword equals zero.

All of the encoded bits are Reed Solomon block coded, and interleaved. The least significant bits are also trellis coded, and go to a SISO or SIHO or HISO trellis decoder. For two to fifteen bit constellations, the two least significant bits are trellis coded, for one bit constellations, one bit is trellis coded.

The notation $L(;;)_n$ is used to refer to the log likelihood ratios of bits of iteration n. Where the first parameter refers to the code: i for the inner code, and o for the outer code. The second parameter refers to the decoders: i for the input, o for the output, e for extrinsic information, and a for a priori information. And the third parameter is optional, and refers to the range of bits: m for most significant bits (MSBs), and l for least significant bits (LSBs).

Figure 10:
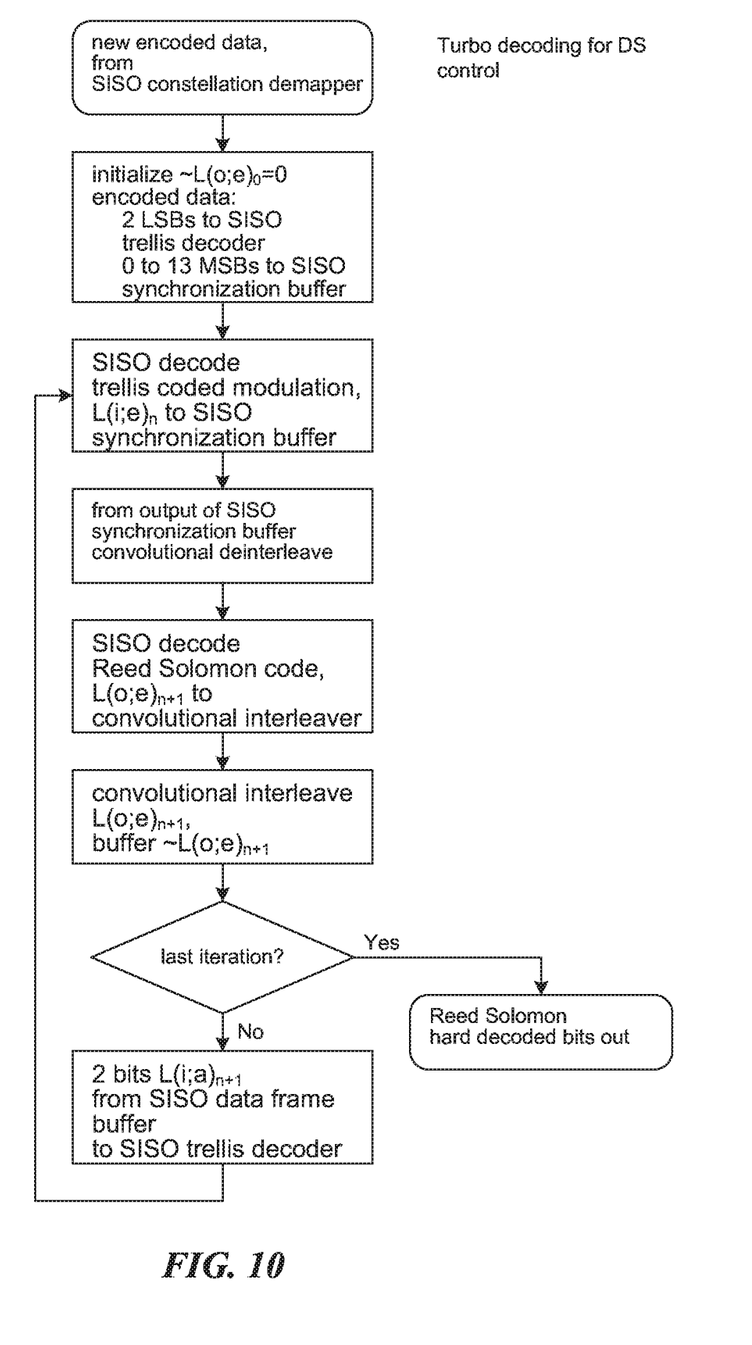
FIG. 10 is a flowchart representation of turbo decoding for DSL control.
Figure 11:
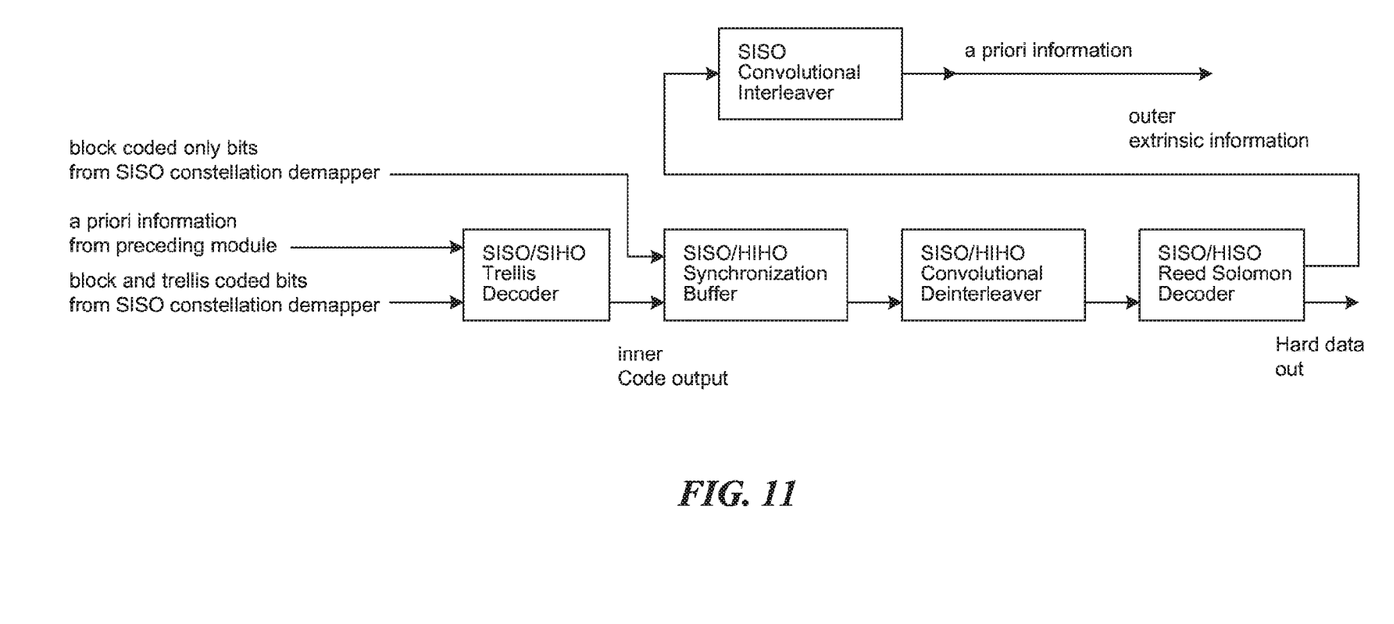
FIG. 11 is a block diagram representation of a pipelined decoding module for DSL.

FIG. 10 is a flowchart representation of turbo decoding for DSL control. FIG. 11 is a block diagram representation of a pipelined decoding module for DSL. In various embodiments, the trellis decoder may be either SISO or SIHO. The 2 LSBs from the SISO constellation demapper are the received encoded bits input to the SISO (or SIHO) trellis decoder. And 3 bits of a priori information are input to the SISO (or SIHO) trellis decoder. For the first iteration the a priori information=0. For subsequent iterations, the a priori information is 3 soft bits from the SISO convolutional interleaver (which are 3 decoded bits), which correspond to 4 encoded LSBs from the SISO constellation demapper, i.e., 2 encoded LSBs from two successive constellations. The a priori information to the inner decoder L(i;a) is the buffered 3 least significant bits of the interleaved extrinsic information from the previous iteration of the outer decoder, ~L(o;e). With L(i;o) the output of the inner decoder, and the inner extrinsic information, L(i;e)=L(i;o)−L(i;a).

In some embodiments, the algorithms for the SISO trellis decoding are the logarithmic version of the Maximum a Posteriori algorithm (log MAP), and the Soft Output Viterbi Algorithm (SOVA). Both perform exhaustive searches of the trellis, and are practical for a 16 state code. Both the log MAP, and SOVA algorithm have versions which use forward and backward passes, or are forward only with a sliding window. The trellis code used in the ADSL and VDSL standards is Wei's 4-dimensional, 16 state trellis code, which places specific requirements on the decoder. The log MAP algorithm uses additions in place of multiplications in the MAP algorithm, and the maxlog MAP algorithm has been shown to be equivalent to the Soft Output Viterbi Algorithm. At low $E_b/N_0$ ratios, the log MAP algorithm may outperform the SOVA by up to 0.7 dB.

Figure 7:
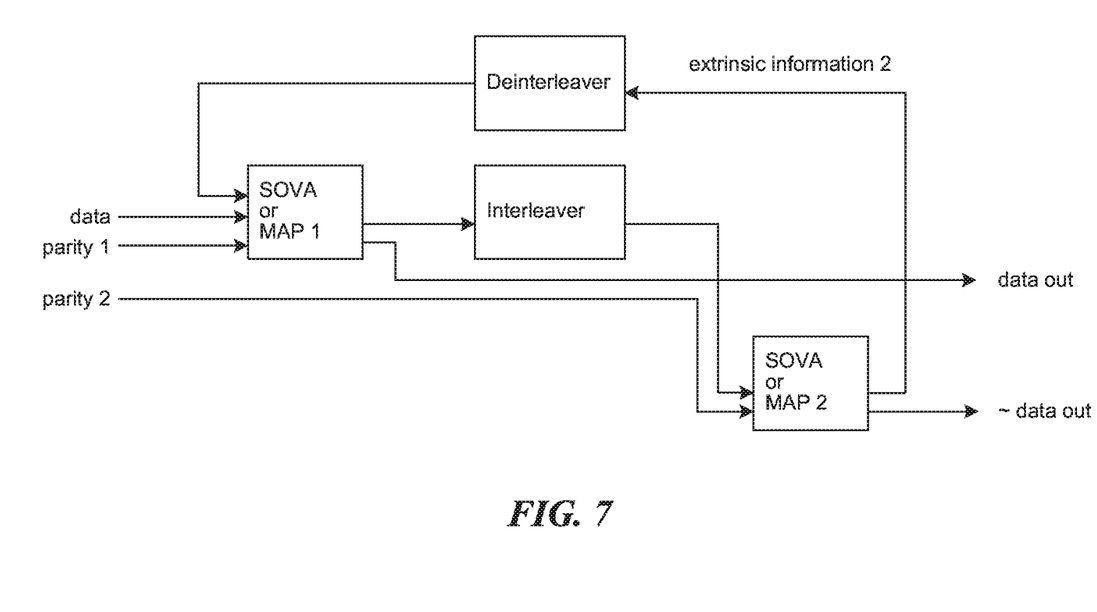
FIG. 7 illustrates a turbo decoder for parallel concatenated convolutional codes.
Figure 8:
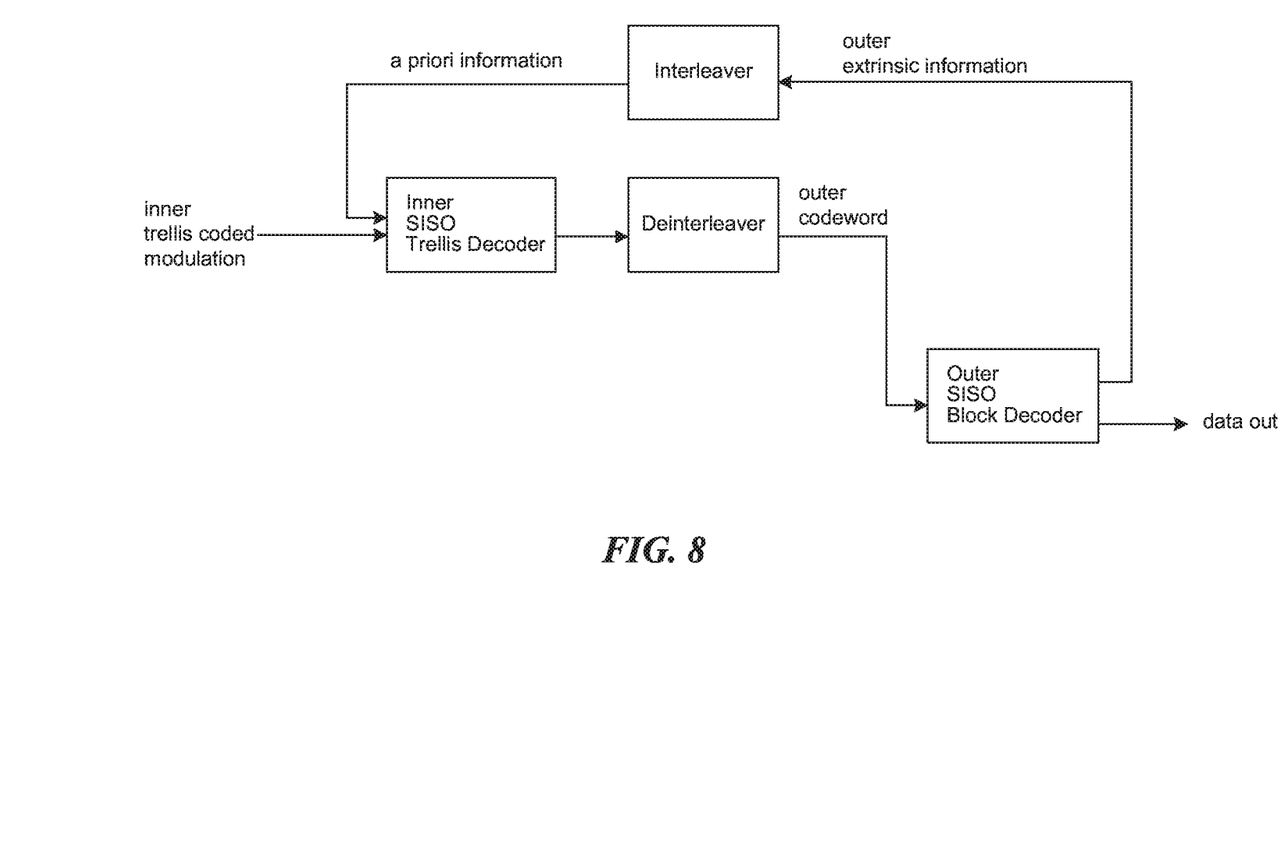
FIG. 8 illustrates a turbo decoder for serially concatenated TCM and block codes.

With reference to FIG. 7 and FIG. 8, in some embodiments, the algorithm for the SIHO trellis decoding is the Viterbi algorithm. It performs exhaustive searches of the trellis, and is practical for a 16 state code. The trellis code used in the ADSL and VDSL standards is Wei's 4-dimensional, 16 state trellis code, which places specific requirements on the decoder.

In some embodiments, one or more of the first iterations of turbo decoding, which typically operates at high bit error rates (compared to later iterations), may use SISO trellis decoding, with the soft output of the trellis decoding providing additional reliability information for the Reed Solomon decoding, and the later iterations of the turbo decoding, which operate at low bit error rates, may use SIHO trellis decoding.

Referring to FIG. 10 and FIG. 11, the data and any extrinsic information from the inner decoder L(i;e), and the interleaved msbs going to the outer decoder's input ~L(o;i; m) are input to the SISO (or HIHO) synchronization buffer. The synchronization buffer is used to synchronize the MSBs from the SISO constellation demapper, which are block coded only, with the data and any inner extrinsic information from the trellis decoder, L(i;e), which has a decoding latency. Note that constellations of 3 or more bits have msbs. After synchronization, the soft or hard bits are assembled into soft or hard bytes. The bytes from the synchronization buffer go to a convolutional deinterleaver. The deinterleaved bytes are the codewords, L(o;i), input to the outer SISO (or HISO) Reed Solomon decoder.

Next, SISO (or HISO) decoding of the outer Reed Solomon code is performed. With L(o;i) the systematic input to the decoder, and L(o;o) the output of the decoder, the outer extrinsic information is L(o;e).

The log MAP and SOVA algorithms are currently impractical for decoding Reed Solomon codes. Some other possible methods of SISO Reed Solomon decoding include: Reliability assisted hard decision decoding algorithms, including Chase type algorithms. Algebraic list decoding algorithms, including the Koetter and Vardy algorithm. Ordered statistics decoding, including the box and match algorithm, and iterative decoding algorithms.

Possible methods of HISO Reed Solomon decoding include: Hard decision algebraic decoding algorithms, with output LLRs based on intermediate or final results of the algebraic decoding, and Stochastic Chase type algorithms.

The outer extrinsic information L(o;e), from the SISO or HIHO Reed Solomon decoder, is fed back to a SISO convolutional interleaver, giving ~L(o;e). With a convolutional interleaver the interleaved outer extrinsic information is calculated from bits that are in three stages of decoding: Bits that have completed decoding by the outer decoder. Bit that are being decoded by the outer decoder. Bits for which an outer codeword has not yet been deinterleaved, and have extrinsic information that equals zero.

The interleaved outer extrinsic information may extend over more than one OFDM symbol. Constellations from one or more OFDM symbols are read from the constellations buffer, and input to the SISO constellations demapper, in synchronization with their a priori information.

Decoding iterations continue through SISO trellis decoding, SISO synchronization, SISO deinterleaving, SISO Reed Solomon decoding, and SISO interleaving. Alternatively, iterations may be performed through SIHO trellis decoding, synchronization, deinterleaving, HISO Reed Solomon decoding, and SISO interleaving.

Iterative decoding is considered to have converged when the decoders agree on the output (outputs match). The number of iterations is typically greater than or equal to two, and less than or equal to sixty four, after which hard bits can be output as the decoded data. In some embodiments, a hard output algebraic Reed Solomon decoder may also be incorporated, and hard bits output when it indicates a successful decoding.

The turbo architecture for iterative decoding uses one of each of the decoding blocks, and feedback. A pipelined architecture (which is analogous to loop unrolling) is an alternative. With reference to FIG. 11, a pipelined architecture contains multiple decoding modules, typically one module for each decoding iteration. In the pipelined architecture for decoding DSL, a decoding module may contain: A SISO trellis decoder, a SISO synchronization buffer, a SISO convolutional deinterleaver, a SISO Reed Solomon decoder, a SISO convolutional interleaver. In some embodiments, a decoding module may contain: a SIHO trellis decoder, a synchronization buffer, a convolutional deinterleaver, a HISO Reed Solomon decoder, and a SISO convolutional interleaver.

In some embodiments, the decoding modules are connected serially. With the inputs to each module being the lsbs and msbs output of the SISO constellation demapper, and the a priori information from the previous module. The outputs being the interleaved hard bits and a priori information from the SISO or HISO Reed Solomon decoder. The a priori information to the first module is set to zero. For other modules, their a priori information is generated by a preceding module, and a last active module generates the hard decoded bits.

The pipelined architecture decoding modules may also each contain a SISO constellation demapper, and SISO constellation mapper. In which case they would accept constellations as inputs, rather than the output of the SISO constellation demapper.

Figure 12:
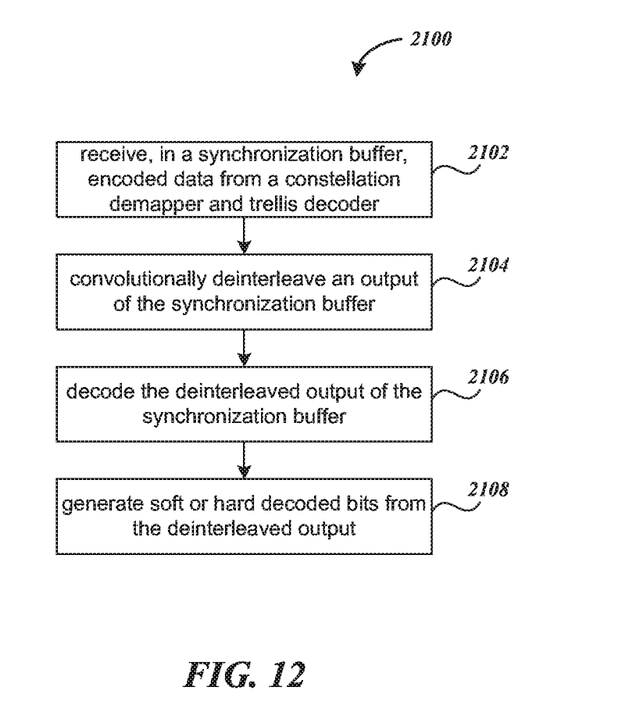
FIG. 12 is a flowchart representation of a process of turbo decoding and turbo equalization.

FIG. 12 is a flowchart representations of a process 2100 for turbo decoding for DSL. At 2102, in a synchronization buffer, encoded data from a constellation demapper and trellis decoder is received. At 2104, an output of the synchronization buffer is convolutionally deinterleaved. At 2106, the deinterleaved output of the synchronization buffer is decoded. At 2108, soft or hard decoded bits are generated from the deinterleaved output.

It will be appreciated that techniques are disclosed for turbo decoding OFDM symbols. It will further be appreciated that techniques for combined turbo decoding and equalization are disclosed. The disclosed techniques can be implemented in receivers that receive wired or wireless OFDM signals and produce data and control bits by decoding the received signals.

It will further be appreciated that the use of SISO or HISO or SIHO in bit decoding pipelines is disclosed. In various embodiments, the soft and hard decision logic may be mixed and matched based on hardware and design constraints. Furthermore, soft (or hard) output of a previous stage would have to be input correspondingly to a soft (or hard) input of a next stage. Furthermore, one of skill in the art would also appreciate that input to a turbo decoder is typically soft information, and in some cases just lsbs of the constellations. The a priori information, in the iterative process described herein, that is passed from one iteration to a next iteration is soft information, but inside each iteration, modules could use soft or hard information, based on implementation resources, such that output of a pervious module matches (soft or hard) input of a next module.

The disclosed and other embodiments and the functional operations and modules described in this document can be implemented in digital electronic circuitry, or in computer software, firmware, or hardware, including the structures disclosed in this document and their structural equivalents, or in combinations of one or more of them. The disclosed and other embodiments can be implemented as one or more computer program products, i.e., one or more modules of computer program instructions encoded on a computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them. A propagated signal is an artificially generated signal, e.g., a machine-generated electrical, optical, or electromagnetic signal, that is generated to encode information for transmission to suitable receiver apparatus.

A computer program (also known as a program, software, software application, script, or code) can be written in any form of programming language, including compiled or interpreted languages, and it can be deployed in any form, including as a standalone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this document can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of nonvolatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

While this document contains many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is:

1. A turbo decoding method for decoding a stream of a plurality orthogonal frequency division multiplexing (OFDM) symbols in which a plurality of constellations are generated by block coding and trellis coding a first number of least significant bits and only block coding a second number of most significant bits, comprising:
   receiving the plurality of orthogonal frequency division multiplexing (OFDM) symbols;
   demodulating the plurality of OFDM symbols to obtain a plurality of signal constellations having variable sizes inputting, to a soft input soft output (SISO) constellation demapper, the plurality of signal constellations, along with information about a number of bits represented by each constellation from the plurality of signal constellations;
   operating a soft input soft output (SISO) constellation demapper on constellations of variable sizes to generate an output for subsequent soft decoding, and
   performing convolutional interleaving of a decoded output of the convolutional deinterleaving.

2. The method of claim 1, further comprising:
   synchronizing soft inputs from a SISO trellis decoder and soft inputs from the SISO constellation demapper to produce a plurality of bits and assembling the plurality of bits into bytes.

3. The method of claim 1, further including:
   buffering, in a constellation buffer, constellations from the plurality of signal constellations for at least two of the plurality of OFDM symbols.

4. The method of claim 1, further including:
buffering a number of demapped constellations output from the SISO constellation demapper, for at least two of the plurality of OFDM symbols.

5. The method of claim 1, further comprising:
generating hard coded bits, wherein the generating hard coded bits is an iterative process in which a buffer is used to extract a number of bits from an incoming frame.

6. A turbo decoding apparatus, at least partially implemented in hardware, with a feedback or pipelined architecture, and one or more high level modules, for decoding a stream of a plurality orthogonal frequency division multiplexing (OFDM) symbols in which a plurality of constellations are generated by block coding and trellis coding a first number of least significant bits and only block coding a second number of most significant bits, comprising:
a module that demodulates a plurality of OFDM symbols to obtain a plurality of signal constellations having variable sizes;
a module that provides, to a soft input soft output (SISO) constellation demapper, the plurality of signal constellations, along with information about a number of bits represented by each constellation from the plurality of signal constellations; and
a module with either soft inputs soft outputs (SISO) or soft inputs and hard outputs (SIHO) that demaps the constellations of variable sizes to encoded bits;
a module with SISO or SIHO that decodes a trellis code;
a module with SISO, or hard inputs hard outputs (HIHO), that synchronizes inputs from the module that decodes the trellis code and inputs from the module that demaps the constellations, assembles the bits into a plurality of bytes, and outputs the plurality of bytes;
a module with SISO or HIHO that convolutionally deinterleaves the plurality of bytes;
a module with SISO or hard inputs soft outputs (HISO) that decodes the deinterleaved plurality of bytes and generates soft or hard decoded bytes; and
a module with SISO that convolutionally interleaves the decoded bytes and provides a priori information to the module that decodes the trellis code.

7. The apparatus of claim 6, further comprising:
a module with soft inputs and soft outputs that buffers a number of constellations from the plurality of signal constellations, wherein the number is greater than or equal to a depth of interleaving used for encoding the plurality of OFDM symbols.

8. The apparatus of claim 6, further comprising:
a module with soft inputs and soft outputs that buffers a number of demapped constellations output from the SISO constellation demapper, wherein the number is greater than or equal to a depth of interleaving used for encoding the plurality of OFDM symbols.

9. The apparatus of claim 6, further comprising:
a module with soft inputs and soft outputs that buffers on or more data frames corresponding to the bits in an OFDM symbol.

10. The apparatus of claim 6, further comprise a module that generates hard coded bits, wherein the module that generates the hard coded bits using an iterative process such that for all iterations except a last iteration, a buffer is used to extract a number of bits from an incoming frame.

11. The apparatus of claim 6, wherein the two different classes of data comprise a first class of data comprising a synchronization symbol and a second class of data comprising output of an outer decoder of turbo decoding.

12. The apparatus of claim 6, further comprise a plurality of modules connected in a pipelined architecture, wherein, for a first module in the pipelined architecture, the a priori information is equal to zero, for other modules, their a priori information is generated by a preceding module, and a last active module generates the hard decoded bits.

13. A turbo decoding method, at least partially implemented in hardware, with a feedback or pipelined architecture, for decoding a stream of a plurality orthogonal frequency division multiplexing (OFDM) symbols in which a plurality of constellations are generated by block coding and trellis coding a first number of least significant bits and only block coding a second number of most significant bits, comprising:
an operation that demodulates a plurality of OFDM symbols to obtain a plurality of signal constellations having variable sizes;
an operation that provides, to a soft input soft output (SISO) constellation demapper, the plurality of signal constellations, along with information about a number of bits represented by each constellation from the plurality of signal constellations; and
an operation that, with either soft inputs soft outputs (SISO) or soft inputs and hard outputs (SIHO), demaps the constellations of variable sizes to encoded bits;
an operation that, with SISO or SIHO, decodes a trellis code;
an operation that, with SISO, or hard inputs hard outputs (HIHO), synchronizes inputs from the module that decodes the trellis code and inputs from the module that demaps the constellations, assembles the bits into a plurality of bytes, and outputs the plurality of bytes;
an operation that, with SISO or HIHO, convolutionally deinterleaves the plurality of bytes;
an operation that, with SISO or hard inputs soft outputs (HISO), decodes the deinterleaved plurality of bytes and generates soft or hard decoded bytes; and
an operation that, with SISO, convolutionally interleaves the decoded bytes and provides a priori information to the module that decodes the trellis code.

14. The method of claim 13, further comprising:
an operation that, with soft inputs and soft outputs, buffers a number of constellations from the plurality of signal constellations, wherein the number is greater than or equal to a depth of interleaving used for encoding the plurality of OFDM symbols.

15. The method of claim 13, further comprising:
an operation that, with soft inputs and soft outputs, buffers a number of demapped constellations output from the SISO constellation demapper, wherein the number is greater than or equal to a depth of interleaving used for encoding the plurality of OFDM symbols.

16. The method of claim 13, further comprising:
an operation that, with soft inputs and soft outputs, buffers on or more data frames corresponding to the bits in an OFDM symbol.

17. The method of claim 13, further comprise an operation that generates hard coded bits, wherein the operation that generates the hard coded bits using an iterative process such that for all iterations except a last iteration, a buffer is used to extract a number of bits from an incoming frame.

18. The method of claim 13, wherein the two different classes of data comprise a first class of data comprising a synchronization symbol and a second class of data comprising output of an outer decoder of turbo decoding.

19. The method of claim 13, further comprise a plurality of operations implemented in a pipelined architecture, wherein for first operation, the a priori information is equal to zero, for other operations, their a priori information is generated by a preceding operation, and a last operation generates the hard decoded bits.

* * * * *